United States Patent
Reinhard et al.

(10) Patent No.: US 10,658,532 B2
(45) Date of Patent: May 19, 2020

(54) FABRICATING THIN-FILM OPTOELECTRONIC DEVICES WITH ADDED RUBIDIUM AND/OR CESIUM

(71) Applicant: FLISOM AG, Niederhasli (CH)

(72) Inventors: Patrick Reinhard, Zurich (CH); Adrian Chirila, Herznach (CH)

(73) Assignee: FLISOM AG, Niederhasli (CH)

( * ) Notice: Subject to any disclaimer, the term of this patent is extended or adjusted under 35 U.S.C. 154(b) by 0 days.

(21) Appl. No.: 16/077,034

(22) PCT Filed: Jan. 27, 2017

(86) PCT No.: PCT/EP2017/051830
§ 371 (c)(1),
(2) Date: Aug. 9, 2018

(87) PCT Pub. No.: WO2017/137268
PCT Pub. Date: Aug. 17, 2017

(65) Prior Publication Data
US 2019/0035953 A1 Jan. 31, 2019

(30) Foreign Application Priority Data
Feb. 11, 2016 (WO) .................. PCT/IB2016/050728

(51) Int. Cl.
*H01L 31/032* (2006.01)
*H01L 31/0445* (2014.01)
(Continued)

(52) U.S. Cl.
CPC .... *H01L 31/0323* (2013.01); *H01L 21/02491* (2013.01); *H01L 21/02568* (2013.01);
(Continued)

(58) Field of Classification Search
CPC ............... H01L 31/032; H01L 31/0323; H01L 31/0352; H01L 31/0392; H01L 31/035272;
(Continued)

(56) References Cited

U.S. PATENT DOCUMENTS 4,228,315 A   10/1980   Napoli
4,332,880 A   6/1982    Izu et al.
(Continued)

FOREIGN PATENT DOCUMENTS

DE   442824 C        5/1927
DE   10259258 A1     7/2004
(Continued)

OTHER PUBLICATIONS

International Search Report and Written Opinion for PCT/EP2017/051830, dated Mar. 24, 2017, 13 pages.
(Continued)

*Primary Examiner* — Chuong A Luu
(74) *Attorney, Agent, or Firm* — Patterson + Sheridan, L.L.P.

(57) ABSTRACT

A method for fabricating thin-film optoelectronic devices (100), the method comprising: providing a alkali-nondiffusing substrate (110), forming a back-contact layer (120); forming at least one absorber layer (130) made of an ABC chalcogenide material, adding least one and advantageously at least two different alkali metals, and forming at least one front-contact layer (150) wherein one of said alkali metals comprise Rb and/or Cs and where, following forming said front-contact layer, in the interval of layers (470) from back-contact layer (120), exclusive, to front-contact layer (150), inclusive, the comprised amounts resulting from adding alkali metals are, for Rb and/or Cs, in the range of 500 to 10000 ppm and, for the other alkali metals, typically
(Continued)

Na or K, in the range of 5 to 2000 ppm and at most 1/2 and at least 1/2000 of the comprised amount of Rb and/or Cs. The method (200) is advantageous for more environmentally-friendly production of photovoltaic devices on flexible substrates with high photovoltaic conversion efficiency and faster production rate.

20 Claims, 1 Drawing Sheet

(51) Int. Cl.
H01L 21/02 (2006.01)
H01L 31/0352 (2006.01)
H01L 31/0392 (2006.01)
(52) U.S. Cl.
CPC .... *H01L 21/02664* (2013.01); *H01L 31/0322* (2013.01); *H01L 31/03928* (2013.01); *H01L 31/035272* (2013.01); *H01L 31/0445* (2014.12); *Y02E 10/541* (2013.01); *Y02P 70/521* (2015.11)
(58) Field of Classification Search
CPC ........... H01L 31/03928; H01L 31/0445; H01L 31/0322; H01L 31/072; H01L 31/18; H01L 31/0324; H01L 31/048; H01L 31/0272; H01L 31/0264; H01L 31/0296; H01L 31/0336; H01L 31/042; Y02P 70/521; Y02P 10/541
USPC .......................................................... 438/95
See application file for complete search history.

(56) References Cited

U.S. PATENT DOCUMENTS

| | | |
|---|---|---|
| 4,335,266 A | 6/1982 | Mickelsen et al. |
| 4,465,575 A | 8/1984 | Love et al. |
| 4,961,829 A | 10/1990 | Mainzer et al. |
| 5,141,564 A | 8/1992 | Chen et al. |
| 5,441,897 A | 8/1995 | Noufi et al. |
| 6,092,669 A | 7/2000 | Kushiya et al. |
| 6,258,620 B1 | 7/2001 | Morel et al. |
| 6,441,301 B1 | 8/2002 | Satoh et al. |
| 7,785,921 B1 | 8/2010 | Juliano et al. |
| 7,989,256 B2 | 8/2011 | Hakuma et al. |
| 8,193,028 B2 | 6/2012 | Lee |
| 8,415,557 B2 | 4/2013 | Fukunaga et al. |
| 8,709,856 B2 | 4/2014 | Bartholomeusz et al. |
| 8,889,466 B2 | 11/2014 | Gershon et al. |
| 2001/0017154 A1 | 8/2001 | Washio |
| 2002/0106873 A1 | 8/2002 | Beck et al. |
| 2005/0202589 A1 | 9/2005 | Basol |
| 2006/0096635 A1 | 5/2006 | Tuttle |
| 2006/0145190 A1 | 7/2006 | Salzman et al. |
| 2008/0002336 A1 | 1/2008 | Zimmerman et al. |
| 2008/0012006 A1 | 1/2008 | Bailey et al. |
| 2008/0023336 A1 | 1/2008 | Basol |
| 2008/0156372 A1 | 7/2008 | Wu et al. |
| 2008/0169025 A1 | 7/2008 | Basol et al. |
| 2008/0210295 A1 | 9/2008 | Basol |
| 2008/0289680 A1 | 11/2008 | MacFarlane |
| 2009/0092744 A1 | 4/2009 | Pinarbasi et al. |
| 2010/0207515 A1 | 8/2010 | Moyama |
| 2010/0224247 A1 | 9/2010 | Bartholomeusz et al. |
| 2010/0229936 A1 | 9/2010 | Yago et al. |
| 2010/0248420 A1 | 9/2010 | Okamura et al. |
| 2010/0258191 A1 | 10/2010 | Mackie |
| 2010/0261304 A1 | 10/2010 | Chang et al. |
| 2011/0061706 A1 | 3/2011 | Park et al. |
| 2011/0073186 A1 | 3/2011 | Lai et al. |
| 2011/0177645 A1 | 7/2011 | Vasquez et al. |
| 2011/0186102 A1 | 8/2011 | Kobayashi et al. |
| 2011/0203634 A1 | 8/2011 | Wieting |
| 2011/0265845 A1 | 11/2011 | Nasuno et al. |
| 2012/0006395 A1 | 1/2012 | Boussaad et al. |
| 2012/0017986 A1 | 1/2012 | Nakatani |
| 2012/0064352 A1 | 3/2012 | Boussaad et al. |
| 2012/0067407 A1 | 3/2012 | Fujdala et al. |
| 2012/0080091 A1 | 4/2012 | Min et al. |
| 2012/0180870 A1 | 7/2012 | Yamamoto et al. |
| 2012/0201741 A1 | 8/2012 | Ionkin et al. |
| 2012/0214293 A1 | 8/2012 | Aksu et al. |
| 2012/0234375 A1 | 9/2012 | Nakamura et al. |
| 2012/0258567 A1 | 10/2012 | Aksu et al. |
| 2012/0313200 A1 | 12/2012 | Jackrel et al. |
| 2013/0160831 A1 | 6/2013 | Zubeck et al. |
| 2015/0027517 A1* | 1/2015 | Wieting .............. H01L 31/0201 136/251 |
| 2015/0333200 A1* | 11/2015 | Chirila .............. H01L 21/02422 136/256 |
| 2015/0380589 A1 | 12/2015 | Teraji et al. |
| 2016/0268454 A1 | 9/2016 | Gwon |

FOREIGN PATENT DOCUMENTS

| | | | |
|---|---|---|---|
| EP | | 743686 A2 | 11/1996 |
| EP | | 787354 A1 | 8/1997 |
| EP | | 826983 A1 | 3/1998 |
| EP | | 1291932 A2 | 3/2003 |
| EP | | 2309548 A2 | 4/2011 |
| EP | | 2339641 A2 | 6/2011 |
| EP | | 2408023 A1 | 1/2012 |
| EP | | 2463929 A1 | 6/2012 |
| WO | | 2006076788 A1 | 7/2006 |
| WO | | 2007072023 A1 | 6/2007 |
| WO | | 2008088570 A1 | 7/2008 |
| WO | | 2009076403 A1 | 6/2009 |
| WO | | 2011040645 A1 | 4/2011 |
| WO | | 2012037242 A2 | 3/2012 |
| WO | | 2014097112 A1 | 6/2014 |
| WO | | 2015177748 A2 | 11/2015 |
| WO | | 2016042432 A1 | 3/2016 |
| WO | | 2017137268 A1 | 8/2017 |
| WO | | 2017137271 A1 | 8/2017 |

OTHER PUBLICATIONS

Contreras, M., et al., "On the Role of Na and Modifications of Cu (In, Ga) Se2 Absorber Materials Using Thin-MF (M=Na, K, Cs) Precursor Layers," Conference Record of the 26th IEEE Photovoltaic Specialists Conference—1997. PVSC. '97. Annaheim, CA, Sep. 29-Oct. 3, 1997, pp. 359-362.

Maeda et al., "First-principles study on alkali-metal effect of Li, Na, and K in CuInSe2 and CuGaSe2", Jpn. J. Appl. Phys. 54, O*KC20 (2015), Jul. 28, 2015, 9 pages.

Jackson et al., "Properties of Cu(In,Ga)Se2 solar cells with new record efficiencies up to 21.7%" P hys. Status Solidi RRL 9, No. 1, 28-31 (2015) / DOI 10.1002/pssr.201409520, Dec. 16, 2014, 4 pages.

PCT International Search Report and Written Opinion of International Application No. PCT/IB2015/056656, dated Nov. 17, 2015, 8 pages.

PCT International Search Report and Written Opinion of International Application No. PCT/EP2017/051854, dated Mar. 23, 2017, 8 pages.

Contreras et al. "On the Role of Na and Modifications to Cu(In,Ga)Se2 Absorber Materials Using Thin-MF (M=Na, K, Cs) Precursor Layers", Conf. Record of the 26th IEEE Photovoltaic Specialists Conf.—1997. pp. 359-362.

Rudmann, D. Effects of Sodium on Growth and Properties of Cu(In, Ga) Se2 Thin Films and Solar Cells, Doctoral Dissertation, Swiss Federal Institute of Technology.

Beucher, "The Watershed Transformation Applied to Image Segmentation", In 10th Pfefferkorn Conf. on Signal and Image Processing in Microscopy and Microanalysis. Sep. 16-19, 1991, pp. 299-314.

(56) References Cited

OTHER PUBLICATIONS

Wuerz et al. "CIGS Thin-Film Solar Cells and Modules on Enamelled Steel Substrates", Solar Energy and Solar Cells 100 (2012) 132-137.

Chirila et al. "Highly efficient Cu(In,Ga)Se2 solar cells grown on flexible polymer films" Nature Materials Letters, Sep. 18, 2011. pp. 857-861.

Boutboul et al. "On the Surface Morphology of Thin Alkali Halidle Photocathode Films", Nuclear Instruments and Methods in Physics Research A, vol. 438, No. 2-3, Dec. 11, 1999, pp. 409-414.

Chirila A. et al. "Potassium-Induced Surface Modification of Cu(In,Ga)Se2 Thin Films for High-Efficiency Solar Cells", Nature Materials, vol. 12, No. 12, Nov. 3, 2013, pp. 1107-1111.

Reinhard et al. "Features of KF and NaF Post-Deposition Treatments of Cu (In, Ga) Se2 Absorbers for High Efficiency Solar Cells", Chemistry of Materials 27, 2015. pp. 5755-5764.

Gavioli et al. "Self-Assembling of Potassium Nanostructures on InAs (110) surface", Surface Science, vol. 532-535, Jun. 1, 2003, pp. 666-670.

Wuerz et al. (2011) CIGS thin-film solar cells and modules on enamelled steel substrates, Solar Energy Materials & Solar Cells 100 (2012) 132-137.

Chirila et al. (2011) Nature Materials 10, 857-861.

Johnson et al. (2002) Interface Properties of CIGS(S)/Buffer Layers Formed by the Cd-Partial Electrolyte Process, 29 th IEEE PVSC, May 20-24, 2002.

Xu et al. (2011) A novel one-step electrodeposition to prepare single-phase CuInS 2 thin films for solar cells, Solar Energy Materials & Solar Cells 95 (2011) 791-796.

Zhang et al. (2003) Formation of CuInSe 2 and Cu(In,Ga)Se 2 films by electrodeposition and vacuum annealing treatment, Solar Energy Materials & Solar Cells 80 (2003) 483-490.

Chinese Office Action dated Aug. 19, 2015 for Application No. 201280012915.3.

International Search Report and Written Opinion for PCT/IB2015/053736, dated Nov. 27, 2015.

Adrian Chirila, et al., "Potassium-Induced Surface Modification of Cu(In, Ga)Se2 Thin Films for High-Effeciency Solar Cells," Nature Materials, vol. 12. No. 12, Nov. 3, 2013, pp. 1107-1111.

Cojocaru-Miredin O., et al. "Exploring the P—N Junction Region OIn Cu(In,Ga) SeThin-Film Solar Cells at the Nanmeter-Scale," Applied Physics Letters, American Institute of Physics, US, vol. 101, No. 18, Oct. 29, 2012, pp. 181603-3.

Pyuck-Pa Choi et al., "Compositional Gradients and Impurity Distributions in CuInSe2 Thin Film Solar Cells Studied by Atom Probe Tomography," Surface and Interface Analysis, vol. 44, No. 11-12, Nov. 18, 2012, pp. 1386-1388.

Hunger, R., et al., "Removal of the Surface Investion of CuInSe2 Absorbers by NH3, aq Etchings," Proceedings of the 3rd World Conference on Photovoltaic Energy Conversion: Joint Conference of 13th PV Science & Engineering Conference, 3-th IEEE PV Specialists Conference, 18th European PV Solar Energy Conference, May 18, 2003, pp. 556-569.

Balboul, M.R., et al., "Sodium Induced Phase Segregations in CuGaSe2 and CuInSe2 Thin Films," 17th E.C. Photovoltaic Solar Energy Conferenc, Munich Germany, Oct. 22-26, 2001; Proceedings of the International Photovoltaic Solar Energy Conference, Munich: WIP—Renewable Energies, DE vol. Conf. 17, Oct. 22, 2001, pp. 1015-1018.

Zribi, M. et al., "Optical Constant of Na-doped CuInS2 Thin Films," Material Letters vol. 60, No. 1, Jan. 1, 2006, pp. 98-103.

Jehl, Z, et al., "Insights on the Influence of Surface Roughness on Photovoltaic Properties of State of the Art Copper Indium Gallium Diselenide Thin Films Solar Cells," Journal of Applied Physics, American Institute of Physics, US, vol. 111, No. 11, Jun. 1, 2012, pp. 114509-1-114509-7.

\* cited by examiner

FABRICATING THIN-FILM OPTOELECTRONIC DEVICES WITH ADDED RUBIDIUM AND/OR CESIUM

CROSS-REFERENCE TO RELATED APPLICATIONS

This application is a 371 U.S. National Stage of International Application No. PCT/EP2017/051830, filed Jan. 27, 2017, which application claims priority to International Application No. PCT/IB2016/050728, filed Feb. 11, 2016, the entire contents of which are incorporated herein by reference.

FIELD

The present invention relates to solar cells and/or optoelectronic devices manufactured by deposition of thin-films and more particularly to adding alkali metals when forming layers or the layer stack of optoelectronic devices comprising chalcogenide semiconductors or ABC semiconductive compounds.

BACKGROUND

Photovoltaic devices are generally understood as photovoltaic cells or photovoltaic modules. Photovoltaic modules ordinarily comprise arrays of interconnected photovoltaic cells.

A thin-film photovoltaic or optoelectronic device is ordinarily manufactured by depositing material layers onto a substrate. A thin-film photovoltaic device ordinarily comprises a substrate coated by a layer stack comprising a conductive layer stack, at least one absorber layer, optionally at least one buffer layer, and at least one transparent conductive layer stack.

The present invention is concerned with photovoltaic devices comprising an absorber layer generally based on an ABC chalcogenide material, such as an $ABC_2$ chalcopyrite material, wherein A represents elements in group 11 of the periodic table of chemical elements as defined by the International Union of Pure and Applied Chemistry including Cu or Ag, B represents elements in group 13 of the periodic table including In, Ga, or Al, and C represents elements in group 16 of the periodic table including S, Se, or Te. An example of an $ABC_2$ material is the $Cu(In,Ga)Se_2$ semiconductor also known as CIGS. The invention also concerns variations to the ordinary ternary ABC compositions, such as copper-indium-selenide or copper-gallium-selenide, in the form of quaternary, pentanary, or multinary materials such as compounds of copper-(indium, gallium)-(selenium, sulfur), copper-(indium, aluminium)-selenium, copper-(indium, aluminium)-(selenium, sulfur), copper-(zinc, tin)-selenium, copper-(zinc, tin)-(selenium, sulfur), (silver, copper)-(indium, gallium)-selenium, or (silver, copper)-(indium, gallium)-(selenium, sulfur).

The photovoltaic absorber layer of thin-film ABC or $ABC_2$ photovoltaic devices can be manufactured using a variety of methods such as chemical vapor deposition (CVD), physical vapor deposition (PVD), spraying, sintering, sputtering, printing, ion beam, or electroplating. The most common method is based on vapor deposition or co-evaporation within a vacuum chamber ordinarily using multiple evaporation sources. Historically derived from alkali material diffusion using soda lime glass substrates, the effect of adding alkali metals to enhance the efficiency of thin-film $ABC_2$ photovoltaic devices has been described in much prior art (Rudmann, D. (2004) Effects of sodium on growth and properties of $Cu(In,Ga)Se_2$ thin films and solar cells, Doctoral dissertation, Swiss Federal Institute of Technology. Retrieved 2012-09-17 from <URL: http://e-collection.ethbib.ethz.ch/eserv/eth:27376/eth-27376-02.pdf>).

Much prior art in the field of thin-film $ABC_2$ photovoltaic devices mentions the benefits of adding alkali metals to increase photovoltaic conversion efficiency and, of the group of alkali metals comprising elements Li, Na, K, Rb, Cs. Best results have been reported when diffusing sodium from precursor layers (see for example Contreras et al. (1997) On the Role of Na and Modifications to Cu(In,Ga)Se2 Absorber Materials Using Thin-MF (M=Na, K, Cs) Precursor Layers, NREL/CP-520-22945), or also EP0787354 by Bodegaard et al., or as well US20080023336 by Basol). More recent prior art provides data regarding diffusion of sodium and potassium from an enamelled substrate while also mentioning that potassium is known to dope CIGS in a similar way as sodium and hinders the interdiffusion of CIGS elements during growth of the absorber layer (Wuerz et al. (2011) CIGS thin-film solar cells and modules on enamelled steel substrates, Solar Energy Materials & Solar Cells 100 (2012) 132-137). Most detailed work has usually focused on adding or supplying sodium at various stages of the thin-film device's manufacturing process For reference, the highest photovoltaic conversion efficiency achieved in prior art for a photovoltaic cell on a polyimide substrate, i.e. on a alkali-nondiffusing substrate, with an $ABC_2$ absorber layer where sodium is added via physical vapor deposition of NaF, is about 18.7%, as reported in Chirila et al. (2011) Nature Materials 10, 857-861.

The controlled addition of potassium from sources external to a potassium-nondiffusing substrate has also been described in WO 2014/097112 of the present applicants.

SUMMARY

This invention presents a solution to the problem of manufacturing high efficiency thin-film photovoltaic or optoelectronic devices that comprise an $ABC_2$ chalcopyrite absorber layer, especially flexible photovoltaic devices with said absorber layer, and more precisely devices manufactured onto substrates, such as polyimide, that do not comprise within the substrate alkali metals known to augment photovoltaic conversion efficiency.

Furthermore, specific addition, in a controlled manner, of substantial amounts of other alkali elements such as Rb and Cs, or of earth-alkali elements (group II of periodic table) has not been reported in the prior art.

Prior art has so far not specifically disclosed how adding, in a controlled manner, substantial amounts of Rb and/or Cs to layers of thin-film $ABC_2$ photovoltaic devices can, especially in combination with sodium and/or potassium, enable the production of a class of photovoltaic devices with superior photovoltaic conversion efficiency. Prior art does not disclose how much Rb and/or Cs should be comprised within devices resulting from a controlled addition. In the field of manufacturing of flexible photovoltaic devices, there is a strong need for know-how regarding the controlled addition of alkali metals since some lightweight flexible substrates such as polyimide do not comprise the alkali metals known to passively diffuse out of rigid substrates such as soda-lime glass or enameled substrates.

Furthermore, most prior art has assumed that sodium and potassium have similar effects on absorber layer and the optoelectronic device, such as doping, passivation of grain boundaries and defects, elemental interdiffusion, the resulting compositional gradients, and observed optoelectronic characteristics such as enhanced open circuit voltage and fill factor.

This assumption has hindered developments with respect to controlled addition of alkali metal combinations, especially upon addition of higher atomic weight alkali elements such as Rb or Cs. Alkali and earth-alkali elements have a low electronegativity, but their atomic size and weight can differ strongly, and yield very different diffusion behavior when interacting with another material that can be used as photovoltaic device. In view of the different influence of Na and K that was described in recent results (see for example P. Reinhard et al., Features of KF and NaF post-deposition treatments of Cu(In,Ga)Se2 absorbers for high efficiency thin film solar cells, Chemistry of Materials 27, 2015, 5755-5764), combination with additional alkali elements can lead to a further improvement in photovoltaic efficiency. This invention exploits previously unexplored properties of adding specific combinations of Rb and/or Cs preferably with at least one other alkali metal, such as sodium to a thin-film optoelectronic device, and especially to its absorber layer. The invention discloses independent control of separate alkali metals during adding to layers of the optoelectronic device. Besides aforementioned effects such as doping, passivation of grain boundaries and defects, passivation of surface defects, elemental interdiffusion, and observed optoelectronic characteristics such as enhanced open circuit voltage (thereby lower temperature coefficient of finished device) and fill factor (thereby better low-light performance), the invention's adding of alkali metals enables manufacturing of a thinner optimal buffer layer. This thinner optimal buffer layer results in reduced optical losses, thereby contributing to increase the device's photovoltaic conversion efficiency.

This invention not only specifies a method to add combinations of alkali elements, but also the amount of alkali elements that should remain in the resulting thin-film device and, in case more than one alkali is the ratio of the different alkali elements. This invention also makes use of the enhanced reactivity of the alkali elements in the near-surface region of the absorber layer to enable an increase of the web speed used during the alkali treatment, yielding a higher production throughput. The modified near-surface region also allows a laser patterning step with lower threshold power, saving thereby energy for monolithic interconnection of solar cells to modules.

The invention presents photovoltaic devices that comprise a controlled amount of Rb and/or Cs and describes the characteristics of said devices. The invention also presents a method for manufacturing said devices with the advantage of reduced optical losses and therefore enhanced photovoltaic conversion efficiency. The method is especially advantageous for the production of flexible photovoltaic devices based on plastic substrates. Devices manufactured according to said method have higher photovoltaic efficiency and possibly less unwanted material than equivalent devices manufactured using methods described in prior art. Devices manufactured according to said method have a lower temperature coefficient enabled by a higher open circuit voltage and can be monolithically interconnected at a lower laser power than when using methods described in prior art.

A common problem in the field of thin-film photovoltaic devices relates to doping of the photovoltaic absorber layer for increased efficiency. When manufactured onto glass substrates or possibly onto substrates coated with materials comprising alkali metals, the substrate's alkali metals may diffuse into the absorber layer and increase photovoltaic conversion efficiency. In the case of substrates, such as polyimide, that do not comprise alkali metals, the alkali-doping elements must be supplied via deposition techniques such as, for example, physical vapor deposition. The alkali metals then diffuse during the deposition process within and across various thin-film layers and their interfaces.

Another problem in the field of thin-film photovoltaic devices lies at the interfaces between the absorber layer, the optional buffer layer, and the front-contact. The absorber layer's $ABC_2$ chalcopyrite crystals present substantial roughness that may require the deposition of a relatively thick buffer layer to ensure complete coverage of the absorber layer prior to deposition of the front-contact layer.

A further problem in the field of thin-film photovoltaic devices is that some facets of the grains on the surface of some absorbers show a different reactivity. In order to grow a fully covering buffer layer by a wet process, it is necessary to adjust the duration for the slowest growth speed, thereby unnecessarily increasing the thickness of the buffer layer on facets with faster growth speed.

A further problem in the field of thin-film photovoltaic devices is that for some buffer layer compositions, the thicker the buffer layer, the lower its optical transmittance and therefore the lower the photovoltaic device's conversion efficiency.

Yet a further problem in the field of thin-film photovoltaic devices is that some buffer layer compositions, such as CdS, comprise the element cadmium, the quantity of which it is desirable to minimize.

A further problem in the field of thin-film photovoltaic devices is that some alternative buffer layers, such as ZnOS, show a metastable photovoltaic efficiency.

Another problem in the field of thin-film photovoltaic device manufacturing is that the process for deposition of the buffer layer, such as chemical bath deposition (CBD), may generate waste. In the case of CdS buffer layer deposition the waste requires special treatment and it is therefore desirable to minimize its amount.

Yet another problem in the field of thin-film photovoltaic devices comprising a CdS buffer layer is that when the buffer layer thickness is less than about 40 nm, the photovoltaic device's fill factor and open circuit voltage are substantially lower than with photovoltaic devices having a buffer layer thickness greater than 40 nm.

Another problem in the field of thin-film photovoltaic device manufacturing is that the process of addition of alkali elements is a reactive process and requires a minimum amount of time to yield a device with enhanced photovoltaic properties.

Finally, yet another problem in the field of flexible thin-film photovoltaic device manufacturing is that it is desirable to benefit from large process windows for material deposition, and more specifically in relation to this invention, the process window for the adding of alkali metals and subsequent deposition of at least one buffer layer.

The invention proposes a method of fabricating thin-film optoelectronic devices, the method comprising the following steps (i) to (v).

Step (i) comprises providing an alkali-nondiffusing substrate.

Step (ii) comprises forming a back-contact layer.

Step (iii) comprises forming at least one absorber layer, which absorber layer is made of an ABC chalcogenide material, including ABC chalcogenide material ternary, quaternary, pentanary, or multinary variations, wherein A represents elements of group 11 of the periodic table of chemical elements as defined by the International Union of Pure and Applied Chemistry including Cu and Ag, B represents elements in group 13 of the periodic table including In, Ga, and Al, and C represents elements in group 16 of the periodic table including S, Se, and Te.

Step (iv) comprises adding at least one alkali metal and preferably at least two different alkali metals in elemental form or precursor thereof, the alkali metal(s) being added from a source external to the alkali-nondiffusing substrate; and Step (v) comprises forming at least one front-contact layer.

In the inventive process, said alkali metal(s) comprise(s) Rb and/or Cs and, following forming said front-contact layer in the interval of layers from back-contact layer, exclusive, to front-contact layer, inclusive, the comprised amounts resulting from adding the alkali metals are, for Rb and/or Cs, in the range of 200 to 10000, preferably 500 to 2500, atoms per million atoms (ppm) and, where another alkali metal is present, the other alkali metal(s) is/are in the range of 5 to 10000 ppm and at most 3/2, preferably at most 1/2, and at least 1/2000 of the comprised amount of Rb and/or Cs.

The invention is exemplified by the following illustrations of single or multiple adding of the alkali metals Rb and/or Cs.

One embodiment involves the adding of Rb alone, Cs alone or a combination of Rb and Cs. For this embodiment, the total amount of comprised Rb and/or Cs is preferably in the upper part 1500 to 2000 of the preferred range 1000 to 2000 ppm. This embodiment provides a lesser improvement of efficiency compared to the other embodiments.

A preferred embodiment includes sodium in the following combinations: Na+Rb; Na+Cs; Na+K+Rb; Na+K+Cs; Na+Rb+Cs. Sodium-containing embodiments have the following advantages: higher open circuit voltage (Voc) and faster addition process of the other alkali elements. The preferred ratio of Na to the other elements is between 1/2000 to 1.5, preferably 1/40 to 1/5.

A third embodiment comprises potassium in the following combinations: K+Rb; K+Cs; K+Rb+Cs; K+Na+Rb; K+Na+Cs. Potassium-containing embodiments have the following, not necessarily exclusive, advantages: reduction of buffer layer deposition time and broader process window for high efficiency devices. The preferred ratio of K to the other elements is between 1/2000 to 10, preferably 1/5 to 2.

The inventive method can also comprise adding the alkali earth metals Be, Mg, Ca, Sr and Ba in combination with Rb and Cs and possibly other alkali metals, in the following proportions: 1/20000 to 10, preferably 1/100 to 1/5.

The possible amounts of the various components are summarized in the following Table. The numbers in ppm are the amounts of Rb and/or Cs. The amounts indicated as fractions are the proportions of other metals to Rb and/or Cs. This Table shows preferred and most preferred ranges.

|  | Range | Preferred | Most preferred |
| --- | --- | --- | --- |
| Cs and/or Rb alone | 200-10000 ppm | 500-2500 ppm | 1000-2250, or 1500-2000 ppm |
| Na/Cs, Na/Rb, Na/(K + Rb), Na/(K + Cs), Na/(Cs + Rb) | 5-10000 ppm, 1/2000-1.5 | 1/2000-1/2 | 1/100-1/4, or 1/40-1/5 |
| K/Rb, K/Cs, K/(Cs + Rb) | 5-10000 ppm 1/2000-10 | 1/100-5 | 1/50-4, or 1/5-2 |
| Alkali earth metals | 1/2000-10 | 1/100-1/5 | 1/100-1/10 |

Briefly, the invention thus pertains to a method of fabricating thin-film photovoltaic devices comprising at least one $ABC_2$ chalcopyrite absorber layer and to adding controlled amounts of Rubidium and/or Cesium preferably in combination with at least one other alkali metal. Said thin-film photovoltaic devices comprise—and we hereby define the term "alkali-nondiffusing substrate"—a substrate that is alkali-nondiffusing and/or comprises means, such as at least one barrier layer, that prevent diffusion of alkali from the substrate into at least said $ABC_2$ chalcopyrite absorber layer.

For the purposes of the present invention, the term "adding" or "added" refers to the process in which chemical elements, in the form of individual or compound chemical elements, namely alkali metals and their so-called precursors, are being provided in the steps for fabricating the layer stack of an optoelectronic device for any of:

forming a solid deposit where at least some of the provided chemical elements will diffuse into at least one layer of said layer stack, or simultaneously providing chemical elements to other chemical elements being deposited, thereby forming a layer that incorporates at least some of the provided chemical elements and the other elements, or depositing chemical elements onto a layer or layer stack, thereby contributing via diffusion at least some of the provided chemical elements to said layer or layer stack.

An advantageous effect of the invention is that the optimal thickness for an optional buffer layer coating said absorber layer is thinner than the optimal buffer layer needed for prior art photovoltaic devices with comparable photovoltaic efficiency. Another advantageous effect is that adding very substantial amounts of Rb and/or Cs preferably in combination with at least one other alkali metal results in devices of higher photovoltaic conversion efficiency than if little or no Rb and/or Cs had been added. The invention contributes to shortening manufacturing process, reducing environmental impact of manufacturing and of the resulting device, and greater device photovoltaic conversion efficiency.

In greater detail, the method comprises providing an alkali-nondiffusing substrate, forming a back-contact layer, forming at least one absorber layer made of an ABC chalcogenide material, adding at least two different alkali metals, and forming at least one front-contact layer, wherein one of said at alkali metals is Rb and/or Cs and where, following forming said front-contact layer, in the interval of layers from back-contact layer, exclusive, to front-contact layer, inclusive, the comprised amounts resulting from adding alkali metals are, for Rb and/or Cs, in the range of 200 to 10000 ppm and, for other alkali metals, in the range of 5 to 10000 ppm and at most 3/2, preferably 1/2, and at least 1/2000 of the comprised amount of Rb and/or Cs. All quantities expressed herein as ppm are by the number of atoms of the alkali metal per million atoms in said interval of layers.

In said method, the comprised amount of Rb and/or Cs in said interval of layers may preferably be kept in the range of 1000 to 2000 ppm. Furthermore, said at least one other alkali metal in said interval of layers may be Na or K, preferably Na, the amount of which is in the range of 5 to 500 ppm. More precisely, in said interval of layers the ppm ratio of Rb/Na and/or Cs/Na may be in the range of 2 to 2000. A narrower proportion for Rb/Na or Cs/Na may be from 10 to 100.

In further detail, forming at least one absorber layer may comprise physical vapor deposition. Forming said absorber layer may comprise physical vapor deposition at substrate temperatures in the range of 100° C. to 500° C. Said absorber layer may be Cu(In,Ga)Se2. In said method, adding of at least two different alkali metals may comprise separate adding any of said at least two different alkali metals. Furthermore, adding Rb and/or Cs may comprise adding a precursor such as RbF and or CsF. More precisely, after forming said at least one absorber layer, adding Rb and/or Cs may comprise physical vapor deposition of RbF and or CsF at a substrate temperature lower than 700° C. At a narrower temperature range, after forming said at least one absorber layer, adding Rb and/or Cs may comprise physical vapor deposition of RbF and or CsFat a substrate temperature in the range of 300° C. to 400° C. Furthermore, adding said two alkali metal(s) may be done in the presence of at least one of said C element. In said method, adding at least two different alkali metals may comprise, at a substrate temperature in the range of 320 to 380° C. and after forming said absorber layer, a physical vapor deposition process comprising first adding NaF or KF at a first deposition rate followed by adding RbF and or CsF at a second deposition rate. Said method may comprise forming at least one buffer layer at a step between forming absorber layer and forming front-contact layer. Furthermore, at least one buffer layer may comprise CdS. Forming of said buffer layer may comprise chemical bath deposition resulting in forming at least one buffer layer comprising CdS. Said buffer layer may have a thickness less than 60 nm. In said method, said substrate may be delivered between a delivery roll and a take-up roll of a roll-to-roll manufacturing apparatus. Said substrate may be polyimide.

The invention also pertains to a thin-film optoelectronic device obtainable by the described method, comprising: an alkali-nondiffusing substrate; a back-contact layer; at least one absorber layer, which absorber layer is made of an ABC chalcogenide material as previously described; and at least one front-contact layer, wherein the interval of layers from the back-contact layer, exclusive, to the front-contact layer, inclusive, comprise controlled amounts of Rb and/or Cs with an amount in the referred range of 500 to 10000 ppm, and the comprised amount of other alkali metals is in the range of 5 to 10000 ppm and is at most 3/2, preferably 1/2, and at least 1/2000 of the comprised amount of Rb and/or Cs. Said device may, when measured under standard test conditions (STC), have a characteristic open circuit voltage which is greater than 680 mV and a short circuit current density greater than 32 mA/cm$^2$.

Advantages

The invention's features may advantageously solve several problems in the field of thin-film photovoltaic devices manufacturing, and more specifically manufacturing of the absorber and buffer layer of such devices based on an alkali-nondiffusing substrate. The listed advantages should not be considered as necessary for use of the invention. For manufacturing of thin-film flexible photovoltaic devices manufactured to the present invention, the advantages obtainable over devices and their manufacturing according to prior art include:

Higher photovoltaic conversion efficiency,
Thinner buffer layer,
Faster deposition of buffer layer,
Enlarged buffer layer deposition process window,
Enlarged deposition process window for alkali metal doping elements,
More environmentally-friendly manufacturing process and devices,
Lower manufacturing costs
Lower temperature coefficient of the modules
Shorter minimum alkali deposition time
Reduced corrosion of back-contact during alkali treatment
Na+Cs or Na+Rb work better than Na+K.
Reduction of metastabilities when using buffer layers other than CdS
Shorter duration of alkali addition treatment possible
Laser patterning step with a lower threshold power than in prior art.

Further improvements over prior art are expected especially for Na+Rb and Na+Cs, or Na+K+(Rb or Cs). Na is relatively well known as fast diffuser into the bulk of the absorber, where it passivates grain boundaries and electronic defects. Its influence on the surface-region composition of the absorber is however limited. Larger alkali elements such as K, Rb or Cs are not as effective on the bulk of the absorber, probably due to their lower diffusion constant in CIGS because of their larger size. Therefore Na in combination with Rb and/or Cs will be preferred.

It was shown that a main difference between Na and K happens in the surface region of the absorber, where much K is implanted, and remains in the final device. This leads to the formation of a surface with modified composition that is advantageous for conformal growth of a buffer layer with reduced thickness and good electronic band alignment, yielding a junction with improved properties. It is postulated that this difference in influence between bulk and surface properties will be even stronger when utilizing larger alkali elements such as Rb or Cs.

One additional advantage of Rb or Cs is that their catalytic activity on surface modification is stronger than Na and K, and therefore a shorter reaction time can be enabled, speeding up the alkali treatment process duration significantly.

Addition of Rb or Cs should also improve the temperature coefficient of the modules due to increased open circuit voltage, Voc.

BRIEF DESCRIPTION OF FIGURES

Embodiments of the invention will now be described by way of example, with reference to the accompanying drawings, in which.

DETAILED DESCRIPTION

In more detail, an "alkali-nondiffusing substrate" is a component, ordinarily a sheet of material, that comprises no potassium or other alkali metals or so little thereof that diffusion of potassium or other alkali elements into the subsequently described layers is considered too small to significantly alter the optoelectronic properties of the device. Alkali-nondiffusing substrates also include substrates that comprise means to prevent diffusion of alkali into coatings or layers supported by the substrate. An alkali-nondiffusing substrate may for example be a substrate that has been specially treated or coated with a barrier layer to prevent diffusion of alkali elements into coatings or layers supported by the substrate. Specially treated substrates or barrier-coated substrates ordinarily prevent the diffusion of a broad range of elements, including alkali metals, into coatings or layers supported by the substrate.

For clarity, components in figures showing embodiments are not drawn at the same scale.

Figure 1:
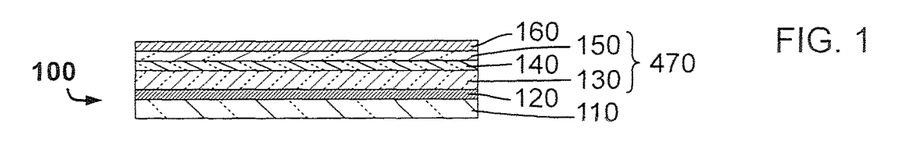
FIG. 1 is a cross-section of an embodiment of a thin-film optoelectronic device.

FIG. 1 presents the cross-section of an embodiment of a thin-film optoelectronic or photovoltaic device 100 comprising an alkali-nondiffusing substrate 110, or also referred to herein as substrate 110, having a stack of material layers disposed thereon to which at least two different alkali metals, one of them being Rb and/or Cs, have been added.

Substrate 110 may be rigid or flexible and be of a variety of materials or coated materials such as glass, coated metal, plastic-coated metal, plastic, coated plastic such as metal-coated plastic, or flexible glass. A preferred flexible substrate material is polyimide as it is very flexible, sustains temperatures required to manufacture high efficiency optoelectronic devices, requires less processing than metal substrates, and exhibits thermal expansion coefficients that are compatible with those of material layers deposited upon it. Industrially available polyimide substrates are ordinarily available in thicknesses ranging from 7 μm to 150 μm. Polyimide substrates are ordinarily considered as alkali-nondiffusing.

At least one electrically conductive layer 120 coats substrate 110. Said electrically conductive layer, or stack of electrically conductive layers, also known as the back-contact, may be of a variety of electrically conductive materials, preferably having a coefficient of thermal expansion (CTE) that is close both to that of the said substrate 110 onto which it is deposited and to that of other materials that are to be subsequently deposited upon it. Conductive layer 120 preferably has a high optical reflectance and is commonly made of Mo although several other thin-film materials such as metal chalcogenides, molybdenum chalcogenides, molybdenum selenides (such as MoSe2), Na-doped Mo, K-doped Mo, Na- and K-doped Mo, transition metal chalcogenides, tin-doped indium oxide (ITO), doped or non-doped indium oxides, doped or non-doped zinc oxides, zirconium nitrides, tin oxides, titanium nitrides, Ti, W, Ta, Au, Ag, Cu, and Nb may also be used or included advantageously.

At least one absorber layer 130 coats electrically conductive layer 120. Absorber layer 130 is made of an ABC material, wherein A represents elements in group 11 of the periodic table of chemical elements as defined by the International Union of Pure and Applied Chemistry including Cu or Ag, B represents elements in group 13 of the periodic table including In, Ga, or Al, and C represents elements in group 16 of the periodic table including S, Se, or Te. An example of an ABC2 material is the Cu(In,Ga)Se2 semiconductor also known as CIGS.

Optionally, at least one semiconductive buffer layer 140 coats absorber layer 130. Said buffer layer ordinarily has an energy bandgap higher than 1.5 eV and is for example made of CdS, Cd(S,OH), CdZnS, indium sulfides, zinc sulfides, gallium selenides, indium selenides, compounds of (indium, gallium)-sulfur, compounds of (indium, gallium)-selenium, tin oxides, zinc oxides, Zn(Mg,O)S, Zn(O,S) material, or variations thereof.

At least one transparent conductive front-contact layer 150 coats buffer layer 140. Said transparent front-contact conductive layer 150, also known as the front-contact, ordinarily comprises a transparent conductive oxide (TCO) layer, for example made of doped or non-doped variations of materials such as indium oxides, tin oxides, or zinc oxides.

Contributing to this invention, the amount of Rb and/or Cs comprised in the interval of layers 470 from electrically conductive layer 120, exclusive, to transparent conductive front-contact layer 150, inclusive, is in the range between 20 or preferably 500 and 10000 Rb and/or Cs atoms per million atoms (ppm) and the amount of other alkali metals when present is in the range of 5 to 10000 ppm and at most preferably 1/2 and at least 1/2000 of the comprised amount of Rb and/or Cs. A thin-film photovoltaic device demonstrating superior photovoltaic conversion efficiency preferably has an amount of Rb and/or Cs comprised in said interval of layers 470 in the range between 1000 and 2000 Rb and/or Cs atoms per million atoms.

Optionally, front-contact metallized grid patterns 160 may cover part of transparent conductive front-contact layer 150 to advantageously augment front-contact conductivity. Also optionally, said thin-film photovoltaic device may be coated with at least one anti-reflective coating such as a thin material layer or an encapsulating film.

Figure 2:
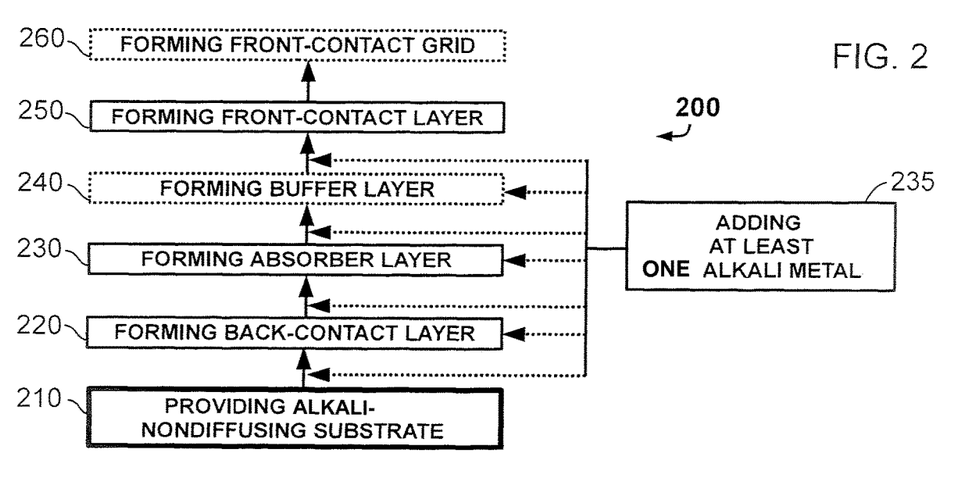
FIG. 2 presents steps in a method to manufacture a thin-film optoelectronic device.

FIG. 2 presents a method 200 comprising material deposition steps to manufacture said thin-film optoelectronic or photovoltaic device 100 comprising an alkali-nondiffusing substrate 110 for a stack of material layers where one and preferably at least two different alkali metals, one or both of them being Rb or Cs, have been added. The method implies the use of substrates considered alkali-nondiffusing or that may comprise at least one barrier layer that prevents the diffusion of alkali metals from the substrate into subsequently deposited coatings. The method as described is especially advantageous for plastic substrate materials such as polyimide.

An exemplary sequence of material layer deposition follows. The purpose of this description is to clarify the context within which adding of alkali metals, the main subject of this invention, occurs.

The method starts at step 210 by providing an alkali-nondiffusing substrate. Said substrate is considered as alkali-nondiffusing, according to the description provided for substrate 110.

Following step 210 and until the step of forming front-contact layer 250, adding preferably at least two different alkali metals, one of them being Rb and/or Cs, occurs as at least one event during and/or between any of steps comprised in the interval from step 210, exclusive, to step 250, exclusive. The fact that the adding may occur during or between said interval of steps is represented by dashed arrows emanating from block 235 in FIG. 2. Each of said alkali metals may be added simultaneously with any of the other of said alkali metals and/or during separate adding events. Adding of each of said alkali metals may comprise any or a combination of adding a layer or precursor layer of at least one of the alkali metals, co-adding at least one of the alkali metals with the forming of any of the method's material layers, or diffusing at least one of the alkali metals from at least one layer into at least one other material layer. Preferably, adding of at least one of said two different alkali metals is done in the presence of at least one said C element. More preferably, adding of Rb and/or Cs, for example by adding via a so-called Rb and/or Cs-comprising precursor such as RbF, RbCl, RbBr, RbI, Rb2S, Rb2Se, is done in the presence of at least one said C element.

At step 220, forming at least one back-contact layer comprises depositing at least one electrically conductive layer. Forming of the back-contact layer may be done using a process such as sputtering, spraying, sintering, electrodeposition, CVD, PVD, electron beam evaporation, or spraying of the materials listed in the description of said electrically conductive layer 120.

At step 230, forming at least one absorber layer comprises coating said electrically conductive layer 120 with at least one ABC absorber layer 130. The materials used correspond to those in the description provided for ABC absorber layer 130. Said absorber layer may be deposited using a variety of techniques such as sputtering, spraying, sintering, CVD, electrodeposition, printing, or as a preferred technique for an ABC material, physical vapor deposition. Substrate temperatures during absorber layer deposition are ordinarily comprised between 100° C. and 650° C. The range of temperatures and temperature change profiles depend on several parameters including at least the substrate's material properties, the supply rates of the materials that compose the ABC material, and the type of coating process. For example, for a vapor deposition process, substrate temperatures during forming of the absorber layer will ordinarily be below 600° C., and if using substrates requiring lower temperatures, such as a polyimide substrate, preferably below 500° C., and more preferably in the range from 100° C. to 500° C. For a co-evaporation vapor deposition process, substrate temperatures during forming of the absorber layer will ordinarily be in the range from 100° C. to 500° C. Said substrate temperatures may be advantageously used with a polyimide substrate.

For a deposition process such as physical vapor deposition, for example if forming absorber layer step 230 is done using a physical vapor deposition process, adding of Rb and/or Cs as part of adding alkali metals may be done during and/or in continuation of the physical vapor deposition process by supplying Rb and/or Cs fluoride, RbF and/or CsF. This may for example be advantageous when manufacturing with a co-evaporation physical vapor deposition system. Adding the alkali metal Rb and/or Cs will preferably be done in the presence of a flux of element Se supplied at a rate in the range of 5 to 100 Å/s, preferably at a rate in the range of 20 to 50 Å/s.

Substrate temperatures for said adding of at least two different alkali metals will ordinarily be greater than 100° C. and less than 700° C. Substrate temperatures will preferably be greater than 300° C. and less than 400° C. A person skilled in the art will select appropriate temperatures for said adding of at least two different alkali metals so that they are compatible with the materials deposited, thin-film properties, and substrate. For example, one skilled in the art of physical vapor deposition processes will know that Rb and/or Cs, for example in the form of RbF and/or CsF, may be added at higher temperatures than some other alkali metals such as sodium, for example in the form of NaF. The possibility of higher adding temperature for RbF and/or CsF may advantageously be used to add alkali metals such as potassium or sodium at temperatures closer to those used at step 230 and, as the substrate temperature decreases, to continue with adding of same and/or other alkali metals. A person skilled in the art will also know that adding of at least two different alkali metals may take place with adding of one or more of said at least two different alkali metals at substrate temperatures ordinarily lower than 700° C. and possibly much lower than 350° C., such as at ambient temperatures of about 25° C. and below. The substrate may then be heated afterwards, thereby facilitating diffusing of said alkali metals to the thin-film layers of the optoelectronic device, possibly in combination with depositing at least one C element.

The amount of Rb and/or Cs added by adding at least two alkali metals 235 is such that following forming of front-contact layer 150 at later step 250, said amount comprised in the interval of layers 470 from conductive layer 120, exclusive, to front-contact layer 150, inclusive, is typically in the range between 200 and 10000 Rb and/or Cs atoms per million atoms and the amount of the other alkali metals is in the range of 5 to 10000 ppm and at most 3/2, preferably 1/2, and at least 1/2000 of the comprised amount of Rb and/or Cs A thin-film photovoltaic device that has a superior photovoltaic conversion efficiency preferably has an amount comprised in said interval of layers 470 from about 1000 to 2000 Rb and/or Cs atoms per million atoms.

In a variation of the invention, alkali earth metals can also be added in the same way as the alkali metals.

The following steps describe how to complete the manufacture of a working photovoltaic device benefiting of the invention.

At step 240, represented as a dashed box because the step may be considered optional, forming buffer layer comprises coating said absorber layer with at least one so-called semiconductive buffer layer 140. The materials used correspond to those in the description provided for buffer layer 140. Said buffer layer may be deposited using a variety of techniques such as CVD, PVD, sputtering, sintering, electrodeposition, printing, atomic layer deposition, or as a well known technique at atmospheric pressure, chemical bath deposition. Forming of said buffer layer is preferably followed by an annealing process, ordinarily in air or possibly within an atmosphere with controlled composition or even in vacuum, at between 100° C. and 300° C. for a duration of 1 to 30 minutes, preferably 180° C. for a duration of 2 minutes.

To tune the process of forming the buffer layer of step 240, one skilled in the art will ordinarily develop a test suite over a range of buffer coating process durations to manufacture a range of photovoltaic devices comprising a range of buffer layer thicknesses. One will then select the buffer coating process duration that results in highest photovoltaic device efficiency. Furthermore, for the purpose of manufacturing reference devices to be considered as corresponding to prior art devices, one will prepare a range of photovoltaic devices where the step of adding alkali metals that comprises alkali metals but does not comprise the amount of Rb and/or Cs specified in this invention and a lesser amount of other alkali metal(s). Said prior art devices will be coated with said range of buffer layer thicknesses. By comparing said prior art devices with devices manufactured according to the invention, one skilled in the art will notice that the latter have substantially higher photovoltaic conversion efficiency.

At step 250, forming front-contact layer comprises coating said buffer layer 140 with at least one transparent conductive front-contact layer 150. Said front-contact layer ordinarily comprises a transparent conductive oxide (TCO) layer, for example made of doped or non-doped variations of materials such as indium oxide, gallium oxide, tin oxide, or zinc oxide that may be coated using a variety of techniques such as PVD, CVD, sputtering, spraying, CBD, electrodeposition, or atomic layer deposition.

At optional step 260, forming front-contact grid comprises depositing front-contact metallized grid traces 160 onto part of transparent conductive front-contact layer 150. Also optionally, said thin-film photovoltaic device may be coated with at least one anti-reflective coating such as a thin material layer or an encapsulating film.

The steps may also comprise operations to delineate cell or module components. In the context of superstrate-based manufacturing, the order of the method's manufacturing sequence may be partly reversed in the order comprising forming optional front-contact grid 260, forming front-contact layer 250, forming optional buffer layer 240, forming absorber layer 230, adding at least two alkali metals 235, and forming an electrically conductive back-contact layer.

Figure 3:
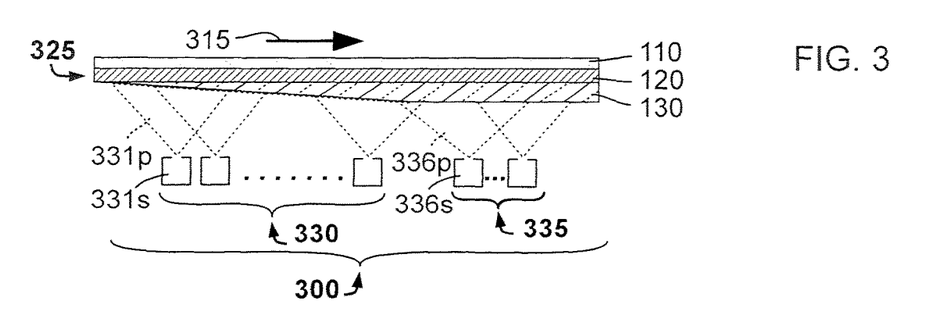
FIG. 3 is a side cross-section of a vapor deposition zone of an apparatus for manufacturing a thin-film optoelectronic device.

FIG. 3 shows a side cross-section of a deposition zone apparatus 300 comprised in a section of an apparatus for manufacturing a thin-film optoelectronic or photovoltaic device comprising an alkali-nondiffusing substrate 110 for a stack of material layers wherein at least two different alkali metals, one of them being Rb and/or Cs, are being added. Deposition zone apparatus 300 is ordinarily comprised inside a vacuum deposition chamber for manufacturing at least the absorber layer of photovoltaic modules. An object to be coated, such as a flat panel or a flexible web, thereafter called web 325, enters deposition zone apparatus 300, travels according to direction 315 over a set of sources for forming at least one absorber layer 230 and at least one set of sources for adding at least two different alkali metals 335, and then exits deposition zone apparatus 300.

Web 325 comprises a substrate 110 coated with an electrically conductive back-contact layer, or stack of electrically conductive layers, thereafter called conductive layer 120. Said substrate, prior to being coated with said stack of electrically conductive layers, is considered as alkali-nondiffusing. For more economical roll-to-roll manufacturing, said substrate 110 is preferably of a flexible material such as coated metal, plastic-coated metal, plastic, coated plastic such as metal-coated plastic, or metal-coated flexible glass. A preferred web 325 is polyimide coated with a conductive metal back-contact, where said back-contact layer is preferably Mo although several other thin-film materials such as non-doped, Na-doped, K-doped, Sn-doped variations of materials such as metal chalcogenides, molybdenum chalcogenides, molybdenum selenides (such as MoSe2), Mo, transition metal chalcogenides, indium oxide (ITO), indium oxides (such as In2O3), zinc oxides, zirconium nitrides, tin oxides, titanium nitrides, Ti, Cu, Ag, Au, W, Ta, and Nb may also be used or included.

The set of absorber deposition sources 330 comprises a plurality of sources 331s generating effusion plumes 331p that, in the case of a preferable co-evaporation setup, may overlap. Said set of absorber deposition sources 330 provides the materials to coat web 325 with at least one absorber layer 130 of ABC material.

In this description, a vapor deposition source, or source, is any device conveying material vapor for deposition onto a layer. The vapor may result from melting, evaporating, or sublimating materials to be evaporated. The device generating the vapor may be at a position that is remote from the substrate 110, for example providing the vapor via a duct, or near the substrate, for example providing the vapor through nozzles or slit openings of a crucible.

The set of sources 335 for adding alkali metals comprises at least one source 336s generating effusion plume 336p adding at least one alkali metal to at least one of the layers of the device 100 prior to it bearing a front-contact. Adding of said alkali metals is preferably done to said absorber layer 130. At least one source 336s comprises Rb and/or Cs, preferably in the form of Rb fluoride, RbF, or Cs fluoride, CsF. Preferably at least one source 336s comprises sodium, preferably in the form of sodium fluoride NaF. These sources may provide other alkali metals, preferably as a co-evaporation setup, and effusion plumes 336p may overlap at least one of effusion plumes 331p. If the set of said sources 335 for adding alkali metals comprises more than one source 336s, the source comprising Rb and/or Cs may be positioned such that its material is added before, at the same time, or after other alkali metals. Furthermore, said apparatus preferably comprises means to provide at least one C element within at least the part of said deposition zone where adding of Rb and/or Cs occurs.

The amount of Rb and/or Cs added by the sources for adding alkali metals sources 335 is such that, following forming of transparent front-contact layer 150, said amount comprised in the interval of layers 470 from conductive layer 120, exclusive, to front-contact layer 150, inclusive, is preferably in the range of 500 to 10000 Rb and/or Cs atoms per million atoms and, for the other alkali metals, in the range 5 to 2000 ppm and at most 1/2 and at least 1/2000 the comprised amount of Rb and/or Cs. A thin-film photovoltaic device 100 that has a superior photovoltaic conversion efficiency preferably has an amount comprised in said interval of layers 470 from about 1000 to 2000 Rb and/or Cs atoms per million atoms.

The location for forming front-contact layer 150 is considered to be outside said deposition zone apparatus 300 and the means for forming said front-contact layer are therefore not represented.

The invention claimed is:

1. A thin-film optoelectronic device, comprising:
   an alkali-nondiffusing substrate;
   a back-contact layer disposed over the alkali-nondiffusing substrate;
   an absorber layer disposed over the back-contact layer, wherein the absorber layer is made of an ABC material, wherein A comprises Cu or Ag, B comprises In, Ga or Al, and C comprises S, Se or Te; and
   a front-contact layer disposed over the absorber layer, wherein a concentration of Rb or Cs in the absorber layer and the front-contact layer is from 500 atoms per million atoms to 2,500 atoms per million atoms (ppm).

2. A thin-film optoelectronic device of claim 1, wherein the absorber layer and the front-contact layer further comprise another alkali metal, and a concentration of the another alkali metal is from 5 ppm to 10,000 ppm, and a ratio of the concentration of the another alkali metal to the concentration of Rb or Cs is at most 3/2 and at least 1/2000.

3. A thin-film optoelectronic device of claim 2, wherein the another alkali metal comprises sodium or potassium, and a concentration of the another alkali metal is about 5 ppm to about 500 ppm.

4. A thin-film optoelectronic device of claim 1, wherein a characteristic open circuit voltage is greater than about 680 mV and a short circuit current density is greater than about 32 mA/cm$^2$ when measured under standard test conditions (STC).

5. A thin-film optoelectronic device of claim 1, wherein the absorber layer comprises Cu(In,Ga)Se$_2$.

6. A thin-film optoelectronic device of claim 1, further comprising a buffer layer between the absorber layer and the front-contact layer.

7. A thin-film optoelectronic device of claim 6, wherein the buffer layer comprises a material selected from the group consisting of cadmium sulfide, zinc oxide, zinc sulfide, zinc oxysulfide, indium sulfide, indium selenide, and combinations thereof.

8. A thin-film optoelectronic device of claim 1, wherein the absorber layer and the front-contact layer further comprise an alkali earth metal.

9. A thin-film optoelectronic device, comprising:
   an alkali-nondiffusing substrate;
   a back-contact layer disposed over the alkali-nondiffusing substrate;
   an absorber layer disposed over the back-contact layer, wherein the absorber layer is made of an ABC material, wherein A comprises Cu or Ag, B comprises In, Ga or Al, and C comprises S, Se or Te; and a front-contact layer disposed over the absorber layer, wherein a concentration of rubidium or cesium in the absorber layer and the front-contact layer is from about 500 atoms per million atoms to about 2,500 atoms per million atoms (ppm), and a concentration of sodium or potassium in the absorber layer and the front-contact layer is from about 5 ppm to about 500 ppm.

10. A thin-film optoelectronic device of claim 9, wherein a ratio of the concentration of sodium or potassium to the concentration of rubidium or cesium is at most about 1 and at least about 1/100.

11. A thin-film optoelectronic device of claim 9, wherein a characteristic open circuit voltage is greater than about 680 mV and a short circuit current density is greater than about 32 mA/cm$^2$ when measured under standard test conditions (STC).

12. A thin-film optoelectronic device of claim 9, wherein the absorber layer comprises $Cu(In,Ga)Se_2$.

13. A thin-film optoelectronic device of claim 9, further comprising a buffer layer between the absorber layer and the front-contact layer.

14. A thin-film optoelectronic device of claim 13, wherein the buffer layer comprises a material selected from the group consisting of cadmium sulfide, zinc oxide, zinc sulfide, zinc oxysulfide, indium sulfide, indium selenide, and combinations thereof.

15. A thin-film optoelectronic device of claim 9, wherein the absorber layer and the front-contact layer further comprise an alkali earth metal.

16. A thin-film optoelectronic device, comprising:

an alkali-nondiffusing substrate;

a back-contact layer disposed over the alkali-nondiffusing substrate;

an absorber layer disposed over the back-contact layer, wherein the absorber layer is made of an ABC material, wherein A comprises Cu or Ag, B comprises In, Ga or Al, and C comprises S, Se or Te;

a front-contact layer disposed over the absorber layer; and a buffer layer between the absorber layer and the front-contact layer, wherein a concentration of rubidium or cesium in the absorber layer and the front-contact layer is from about 500 atoms per million atoms to about 2,500 atoms per million atoms (ppm), and a concentration of sodium or potassium in the absorber layer and the front-contact layer is from about 5 ppm to about 500 ppm.

17. A thin-film optoelectronic device of claim 16, wherein the buffer layer comprises a material selected from the group consisting of cadmium sulfide, zinc oxide, zinc sulfide, zinc oxysulfide, indium sulfide, indium selenide, and combinations thereof.

18. A thin-film optoelectronic device of claim 16, wherein the absorber layer and the front-contact layer further comprise an alkali earth metal.

19. A thin-film optoelectronic device of claim 16, wherein the buffer layer comprises CdS.

20. A thin-film optoelectronic device of claim 19, wherein the buffer layer has a thickness of less than about 60 nm.

* * * * *